United States Patent
Duggal et al.

(10) Patent No.: US 7,624,322 B2
(45) Date of Patent: Nov. 24, 2009

(54) SCAN BASED TESTING OF AN INTEGRATED CIRCUIT CONTAINING CIRCUIT PORTIONS OPERABLE IN DIFFERENT CLOCK DOMAINS DURING FUNCTIONAL MODE

(75) Inventors: Bipin Duggal, Delhi (IN);
Pulamarasetty Bala Kali MuraliKrishna, Visakhapatnam (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/247,228

(22) Filed: Oct. 8, 2008

(65) Prior Publication Data
US 2009/0125771 A1    May 14, 2009

(51) Int. Cl.
*G01R 31/28* (2006.01)
(52) U.S. Cl. ........................................ 714/731; 714/729
(58) Field of Classification Search .................. 714/726, 714/727, 718, 731, 729; 341/158
See application file for complete search history.

(56) References Cited

U.S. PATENT DOCUMENTS

| | | | | |
|---|---|---|---|---|
| 6,877,123 | B2* | 4/2005 | Johnston et al. | 714/731 |
| 7,194,669 | B2* | 3/2007 | Nadeau-Dostie | 714/726 |
| 7,451,371 | B2* | 11/2008 | Wang et al. | 714/729 |
| 7,541,961 | B1* | 6/2009 | Garg | 341/158 |
| 2008/0320348 | A1* | 12/2008 | Ayres et al. | 714/726 |

* cited by examiner

*Primary Examiner*—David Ton
(74) *Attorney, Agent, or Firm*—Ronald O. Neerings; WAde James Brady, III; Frederick J. Telecky, Jr.

(57) ABSTRACT

An integrated circuit containing an encoder which avoids setup/hold violation in a memory element of one clock domain, when receiving data from another memory element of another clock domain during a scan based testing of an integrated circuit. In an embodiment, the encoder receives a test clock, including a capture pulse during a capture mode of the scan test, but forwards the capture pulse only to one of the clock domains and blocking the capture pulse to other clock domains. As a result, erroneous captures in the memory element receiving data from another clock domain is avoided without the need of closing timing on paths which are not functionally exercised.

11 Claims, 9 Drawing Sheets

SCAN BASED TESTING OF AN INTEGRATED CIRCUIT CONTAINING CIRCUIT PORTIONS OPERABLE IN DIFFERENT CLOCK DOMAINS DURING FUNCTIONAL MODE

RELATED APPLICATION

The present application claims the benefit of co-pending India provisional application serial number: 2613/CHE/2007, entitled: "Efficient Scan Testing", filed on Nov. 12, 2007, naming Texas Instruments Inc. (the intended assignee) as the Applicant, and naming the same inventors as in the present application as inventors, and is incorporated in its entirety herewith.

BACKGROUND OF THE INVENTION

1. Technical Field

The present disclosure relates to integrated circuits (IC), and more specifically to scan based testing of an IC containing portions operable in different clock domains when operating in functional mode.

2. Related Art

A scan based test or scan test generally refers to an approach in which storage elements of an integrated circuit (IC) are connected as a scan chain, a scan vector is scanned into the IC through the scan chain, the integrated circuit is placed in an evaluation mode (capture phase) for one or more clock cycles, and the values obtained in the capture cycle are compared with an expected output to determine whether the integrated circuit is operating as desired or not.

On the other hand, functional mode refers to the normal operational mode of an integrated circuit, providing the general utility the circuit is designed for.

An integrated circuit (IC, circuit in general) often contains different portions, which operate based on different clocks. The portions operating based on a single clock are said to operate in corresponding clock domain. Often the phases and/or frequencies of the clock signals are generated without express correlation (i.e., independently or asynchronously).

Scan based testing of such ICs often presents several challenges. Several aspects of the present invention address one or more of such challenges.

SUMMARY

An integrated circuit provided according to an aspect of the present invention contains an encoder which avoids setup/hold violation in a memory element of one clock domain, when the memory element receives data from another memory element of another clock domain during a scan based testing of an integrated circuit.

According to another aspect of the present invention, the encoder is designed to forward a capture pulse to only one portion (of a corresponding clock domain), while blocking the capture pulse to other portions, in each capture cycle. As a result, a timing violation (e.g., hold violation) is avoided and erroneous capture of data is prevented. In an embodiment, the encoder is designed not to affect the clock signals during functional mode and at-speed testing.

According to another aspect of the present invention, only a single test clock is received and stuck-at fault testing is performed for all the portions using the same test clock signal. The need of additional pins needed for testing the integrated circuit, is avoided. In an embodiment, multiplexers are used to selectively forward either the corresponding functional clock (defining the corresponding domains) or the test clock. The encoder operates on the selected clock signals.

According to yet another aspect of the present invention, the integrated circuit is designed to cause a test pattern generator (e.g., ATPG) to generate test patterns, which would automatically cause the encoder to block/pass the capture pulses. In an embodiment, the encoder thus contains memory elements designed to receive a respective pattern in each of a sequence of scan cycles, wherein the pattern determines the specific portions which receives the capture pulse in the corresponding scan cycle. All such memory elements may be designed to be part of a single portion.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

Example embodiments of the present invention will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DESCRIPTION OF EXAMPLE EMBODIMENTS

Various features of the present invention will be clearer in comparison with some prior approaches to scan based testing of an IC with circuit portions operable in different clock domains in the functional mode. Accordingly, the description of some prior approaches is provided first.

Prior Approaches

Figure 1A:
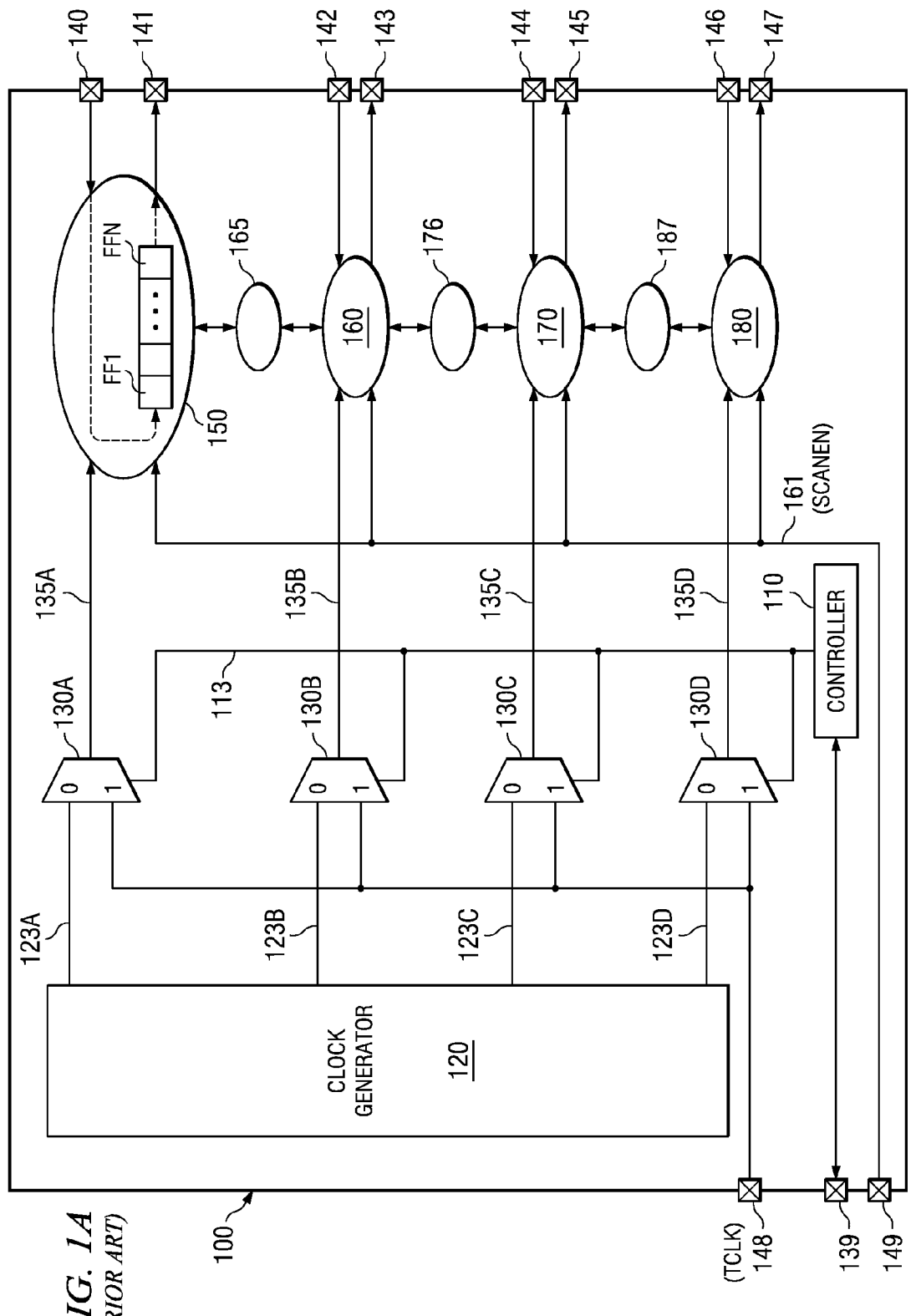
FIG. 1A is a diagram illustrating a scan based testing according to a prior approach.
Figure 1B:
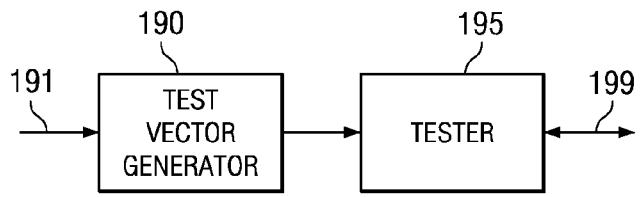
FIG. 1B is a block diagram illustrating (partially) a test environment for testing an integrated circuit in one embodiment.
Figure 2:
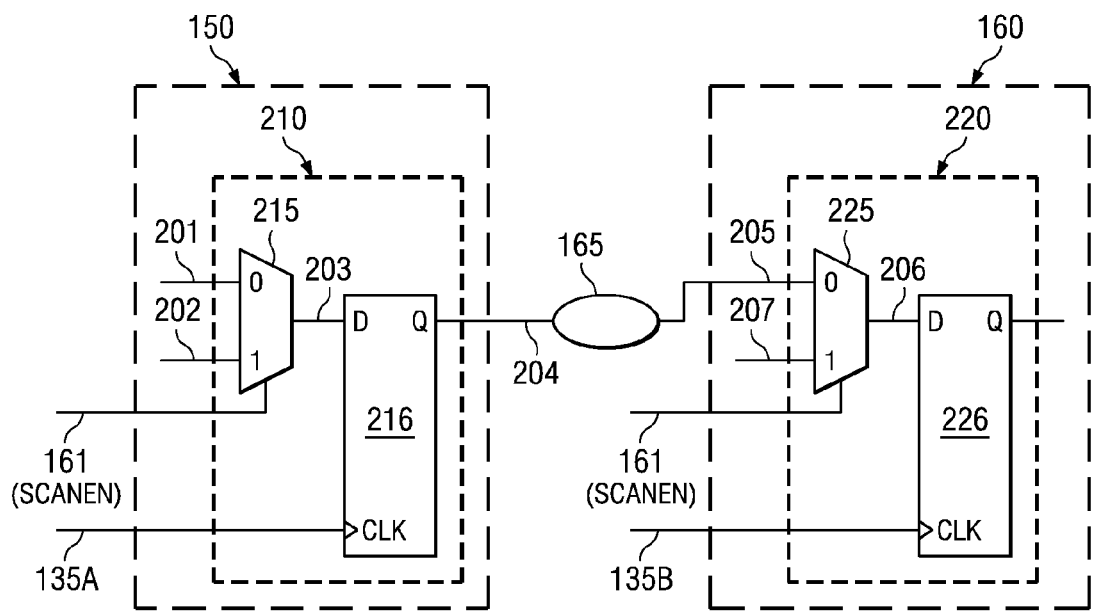
FIG. 2 is a block diagram used to illustrate possible timing violations during a scan based test according to a prior approach.
Figure 3:
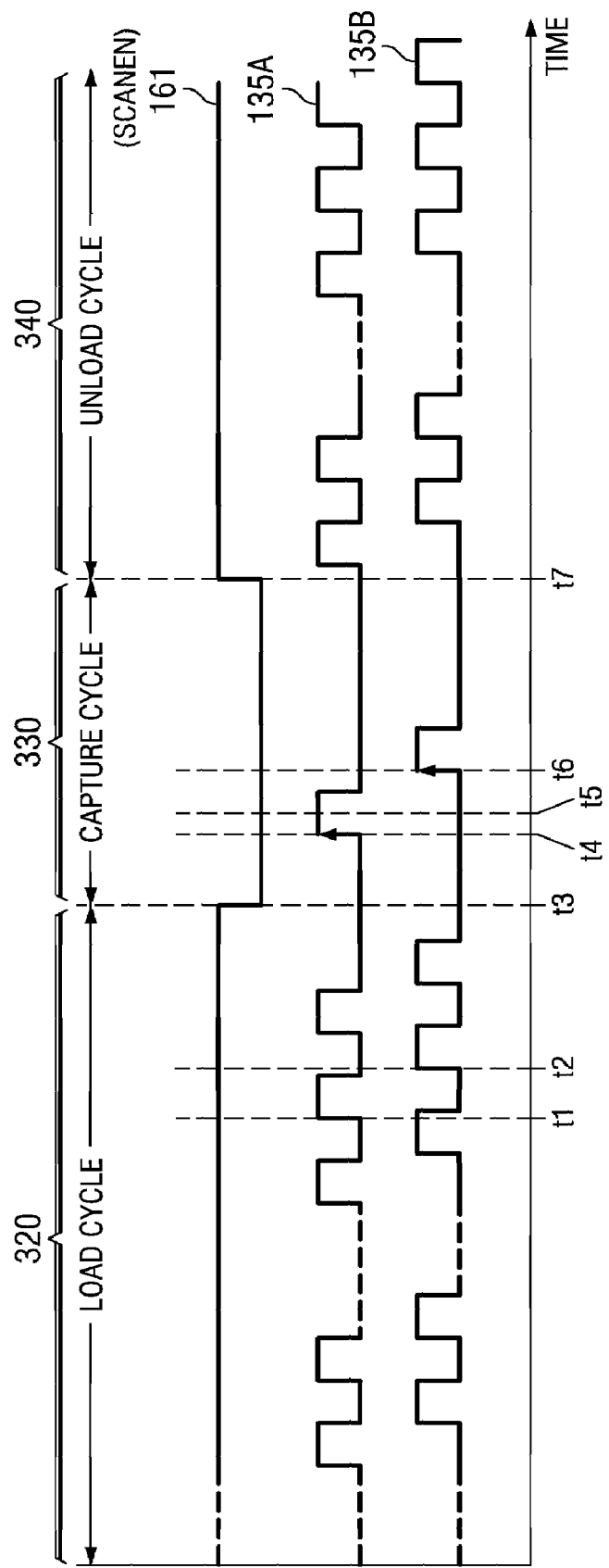
FIG. 3 is a timing diagram illustrating the effects of clock skew during a capture cycle of a scan test in a prior approach.

FIGS. 1A, 2 and 3 are diagrams illustrating a prior approach to scan based testing of an integrated circuit containing portions operable in different clock domains. In FIG. 1, integrated Circuit (IC) 100 is shown containing circuit portions 150, 160, 170 and 180, with each of the portions respectively operating with respect to (functional-mode) clocks 123A, 123B, 123C and 123D (which can be independent/asynchronous) in the functional mode. Clock generator 120 generates the functional clocks 123A-123D. During scan based testing, IC 100 is provided a test clock (test clock 148) via pin 148 from external test equipment (tester).

Multiplexers 130A-130D forward the respective ones of the functional clocks 123A-123D on multiplexer outputs 135A-135D during functional mode operation (control input 113 from controller 110 being a logic 0). During a scan based test (test mode), multiplexers 130A-130D forward test clock 148 on each of outputs 135A-135D (control input 113 being a logic 1). Controller 110 may be programmed or controlled via input pin 139 by the tester to configure IC 100 for corresponding operations in the test mode. Controller 110 may correspond, for example, to TAP (test access port) controller according to the IEEE 1149 (JTAG) specifications, and may contain multiple input and output pins, although only a single pin 139 is shown in FIG. 1. Alternatively, controller 110 may not be implemented, and the tester may directly program the IC for the test mode.

As illustrated in FIG. 1B, and as is well known in the relevant arts, design information (for example, netlist output of a synthesized design of IC 100) may be provided (path 191) to test vector generator 190. Test vector generator 190 (also termed automatic test pattern generator—ATPG) may be designed to analyze the design information, and automatically generate corresponding test vectors. The test vectors are provided to tester 195, which provides the corresponding vectors for each of scan chains in clock domains 150, 160, 170 and 180 of FIG. 1A. Path 199 is deemed to contain paths 139, 140-149 of FIG. 1A.

Each of circuit portions 150, 160, 170, and 180 operates using a different clock, with the clocks having different phases/delays, and/or frequencies with respect to each other, i.e., the clocks may be asynchronous with respect to each other. Circuit portions 150, 160, 170 and 180 may send/receive signals to/from each other via the corresponding interface portions 165, 176 and 187. Paths between circuit portions operating based on different clocks may be termed 'interacting paths between clock domains'. Thus, for illustration the path(s) between portions 150 and 160 (and via interface portion 165) is an interacting path.

Each of interface portions 165, 176 and 187 may contain circuits internally, such as combinatorial circuits, etc. Although FIG. 1 shows only three such interface portions, it should be appreciated that similar interfaces or connections may be present between any two of circuit portions 150, 160, 170 and 180. Each circuit portion may contain combinational and/or sequential circuits. For example, portion 150 is indicated as containing several flip-flops (FF1 through FFN).

As is well known in the relevant arts, during test mode, the flip-flops (storage elements, in general) may be connected to form a scan-chain. With respect to FIG. 1, flip-flops FF1-FFN may be connected in a chain, and receive (from a tester) test vector via pin 140, and provide corresponding scan response vectors via pin 141 back to the tester. The response vector is obtained during a capture cycle, and analyzed following a corresponding scan out cycle.

Similarly, circuit portions 160, 170 and 180 may each contain circuitry internally, with corresponding scan chains being created, and receive and send test and response vectors via pin pairs 142/143, 144/145 and 146/147 respectively. Scan-capable flip flops in each of the scan chains noted above are controlled during a scan test by a scan enable signal (SCANEN) received via pin 149 and path 161. The manner in which a scan-based test is performed is not described in detail, as being well-known in the relevant arts.

One problem with the approach of FIG. 1 is that each of clock paths 135A-135D may contribute different delays (termed clock-skew) to a clock signal (whether functional clocks 123A-123D during functional mode operation, or test clock 148 during test mode), due to different routing lengths, parasitic loads, clock buffers (not shown), etc. The effects of such delays in functional clocks are taken into account during the IC design phase to ensure correct operation in the functional mode, for example by employing synchronizers for data transferred on interacting paths between different clock domains.

However, the design considerations addressed for various possible functional mode scenarios, may not cover the operation that occurs during test-mode operation of IC 100 (using a tester). In particular, the design considerations for functional mode may take into account only the possible combinations of frequencies of operation of the four functional clocks (i.e., in test mode, interface portions 165, 176, 187, etc, may be exercised, but timing closure for such signals may not have been performed when designing the IC, thereby causing errors in the test mode).

As a result, undesirable (potentially erroneous) results may be captured (and operated on) by different portions during a test mode when different clock domains are present in an IC. In particular, signal transfer may occur between clock domains (150, 160, 170 and 180) during a capture cycle, with one or more data inputs to scan elements in a scan chain contained within one clock domain being provided by corresponding elements in another clock domain.

As a result, at least when a single-test clock is used for all the clock domains simultaneously, a data setup and data hold violation may occur during data transfer (in a capture cycle) in an interacting path between different clock domains. As is well known in the relevant arts, a setup time requirement generally specifies a duration of time that a data input to a clocked element (such as a flip flop) should be valid and stable before the active edge of the clock. A hold time requirement generally specifies a duration of time that a data input to a clocked element (such as a flip flop) should be valid and stable after the active edge of the clock.

Data setup violations that may occur in the scenario noted above may be avoided by adding dead (additional or redundant) clock cycles in the capture phase in a known way (for example, by corresponding specifications provided to a tester). However, it may not be possible to avoid data hold time violations in the interacting paths in the capture cycle/phase. An example scenario of data hold violation is illustrated next with respect to FIGS. 2 and 3.

In FIG. 2, scan-enabled flip-flops 210 and 220 are shown contained respectively in clock domains 150 and 160 (of FIG. 1). Each of scan flip flops 210 and 220 contains a multiplexer (215 and 225 respectively), and a storage element (216 and 226 respectively). During scan-in and scan-out operations in test mode, scan-enabled flip flops 210 and 220 receive data via paths 202 and 207 respectively. During a capture phase, scan-enabled flip flops 210 and 220 receive data via paths 201 and 205 respectively.

In FIG. 3, one 'load—capture—unload' sequence during a test mode is depicted. Waveforms 135A and 135B represent clock 148 (of FIG. 1A) at the clock terminals of flip-flops 210 and 220 respectively. A load (shift-in) cycle is denoted by time portion 320 (ending at time instance t3), while a corresponding unload (shift-out) cycle is denoted by time portion 340 (starting at time instance t7). As is well-known, a load cycle represents a duration in which scan vectors are loaded/scanned into the scan chains in an IC, while an unload cycle represents a duration in which captured response data are unloaded back into the scan chains and shifted out into the test equipment. Duration 330 (time interval t3 to t7) represents the corresponding capture cycle after the loading.

Test clock 148 forwarded via paths 135A and 135B respectively to flip-flops 201 and 202 may undergo different delays. Thus, in FIG. 3, active edges (rising) of waveforms 135A and 135B are shown as having a clock skew (represented by interval between time instances t1 and t2). In the example, waveform 135B is shown delayed with respect to waveform 135A. In general, the active edge of one of waveforms 135A and 135B may occur earlier or later than the active edge of the other. Data provided from element 216 at an active edge on clock path 135A should not reach path 205 earlier than a corresponding clock edge on path 135B plus the hold time requirement of flip-flop 220. As an illustration, data provided at clock edge corresponding to time instance t5 time instance should not reach path 205 earlier than corresponding clock edge on 135B at time instance t6 plus the hold time requirement of the flip flop 220 (or the storage element 226).

Due to the clock skew noted above, in the capture cycle, elements 216 and 226 stores (captures) corresponding input data at slightly different time instances. Element 216 stores data 203 at time instance t4, and element 226 stores data 206 at time instance t6. Assuming the combined delay of path 203, interface portions 165 and path 204 is less than the clock skew (plus setup time of element 226 plus delay in multiplexer 225), it is possible that element 226 may store the 'new' (and therefore incorrect) data caused to be provided at time instance t4, instead of storing the previously stored data. As a result, the scanned-out response vector may contain errors due to violation of the hold time requirement of element 226.

One possible technique to overcoming the 'hold-violation' problem noted above is to add a delay on the data path at least equal to the clock skew, for example by adding one or more buffers in the data path (204 or 205). Alternatively, required delays may be added on the clock paths. The addition of buffers in the data and/or clock paths, however, may increase implementation area and power consumption of IC 100, and hence may not be a desirable approach.

Another technique may be to ignore (by masking) the corresponding response bits in the scanned-out response vector. However, such an approach may result in reduced fault coverage (reduced identification of possible faults) thus leading to the drop in the test quality.

Yet another technique is to provide separate test clocks from corresponding number of pins from the tester, with each test clock used for the shift and capture cycles of a corresponding clock domain. Each test clock would then need to be received in a corresponding pin provided on the IC. In order to avoid the impact of unpredictable clock skews among different clock domains, capture cycles (and capture clock instances) of the test clocks are designed not to overlap, with only one test clock activating a capture cycle for the corresponding clock domain in any interval. Such an approach may be implemented internally in the test equipment, and is generally termed 'Capture by Domain' (CBD).

However, the approach requires multiple pins on the IC to be used for providing the multiple test clocks. For example, in the example illustrated with respect to FIG. 1, four pins may be needed on IC 100 to receive four test clocks, one each for clock domains 150, 160, 170 and 180. As a result, the total number of ICs that can be tested simultaneously (referred to as multi-site testing) may reduce, resulting in longer overall test times, higher cost due to the requirement of more number of tester pins, etc.

Several aspects of the present invention overcome one or more of the drawbacks of the prior approaches, and are described next with respect to example embodiments.

Example Embodiments of the Present Invention

Figure 4:
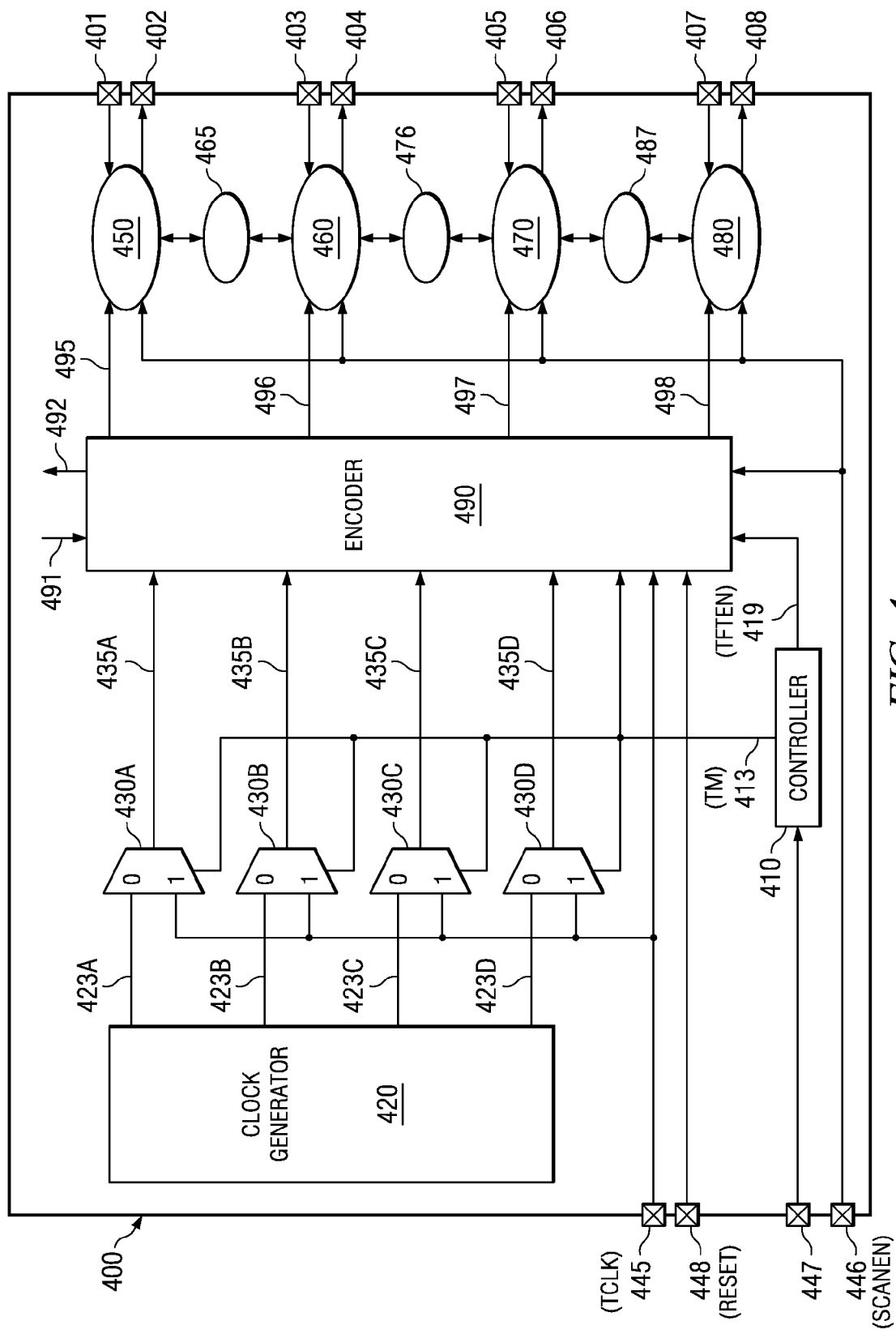
FIG. 4 is a block diagram illustrating the internal details of an IC containing multiple clock domains in an embodiment of the present invention.

FIG. 4 is block diagram illustrating scan based testing of an integrated circuit in an embodiment of the present invention. Integrated Circuit (IC) 400 is shown containing controller 410, clock generator 420, multiplexers 430A-430D, encoder 490, circuit portions 450, 460, 470, 480, and interface portions 465, 476 and 487. Each of circuit portions 450, 460, 470 and 480 operates in a correspondingly different clock domain, using respective functional clocks 423A-423D in the functional mode. Interface portions 465, 476 and 487 and the corresponding connections to the circuit portions represent interacting paths between different clock domains, and are similar to portions 165, 176 and 187 of FIG. 1.

Clock generator 420 generates the functional clocks 423A-423B. During scan based testing, IC 400 is provided a single test clock via pin 445 (TCLK), from an external test equipment, not shown, but which may be similar to tester 195 shown in FIG. 1B. It is assumed in the following description that paths or pins 445, 446, 447, 448, 401-108 are connected to corresponding pins in the tester.

Multiplexers 430A-430D forward the respective ones of the functional clocks 423A-423D on paths 435A-435D during functional mode operation (when control input 413 from controller 410 is logic 0). During a scan based test, multiplexers 430A-430D forward test clock 445 on each of paths 435A-435D (control input 413 being logic 1).

Controller 410 may be programmed or controlled by a tester via input pin 447, to initialize IC 400 suitably before performing a scan based test. Although only a single pin 447 is shown as being connected to controller 410, depending on the specific implementation multiple pins may be connected to controller 410 to provide/receive multiple control signals. For example, when controller 410 is implemented as a TAP (Test Access Port) controller according to the IEEE 1149 (JTAG) specifications, a total of five pins may be required.

Encoder 490 receives clocks on paths 435A-435D both in functional and test modes. When IC 400 is to be operated in functional mode, encoder 490 receives functional clocks 423A-423D as inputs, and is designed to pass the functional clocks without modification (disregarding internal delays) as outputs on respective paths 495, 496, 497 and 498. When IC 400 is to be operated in scan based test mode, encoder 490 receives test clock (TCLK) 445 on each of input paths 435A-435D. Paths 491 and 492 represent respectively an input from and an output to corresponding elements of a scan chain contained in any of clock domains 450, 460, 470 and 480. The signals on paths 491 and 492 are described below with respect to FIG. 6.

Encoder 490 forwards TCLK 445 on output paths 495-498 (without modification) during shift-in (load) and shift-out (unload) cycles. In a time interval corresponding to a capture mode (when SCANEN 446 changes to 0), encoder 490 controls the timing of provision of the capture pulse (received on TCLK 445) to different clock domains such that the respective captures would avoid the setup/hold violations memory elements at the receiving end of the interacting paths.

Hence, the impact of unpredictable clock skews in the test clock (TCLK) provided to the different clock domains 450, 460, 470 and 480) is overcome, and the set-up/hold timing violations noted with respect to the prior approach of FIG. 1A may be avoided.

In an embodiment described below, the capture pulse is provided to only one of the clock domains (and thus disabling the pulse to other domains for the scan test cycles) and the test patterns (and corresponding expected results) are generated accordingly. However, alternative embodiments may be implemented with a longer capture cycle, with the (staggered) capture pulses for different domains being provided sequentially in a non-overlapping manner within such a longer capture cycle. It is noted that using longer capture cycles with staggered clock capture pulses may entail a cost in terms of efficiency in generating test vectors.

In the embodiment described below, disabling of capture pulses is performed only during stuck-at-fault testing (as indicated by test mode signal 413). As a result, the test coverage for each scan cycle is reduced only in case of stuck at fault testing (but not for at-speed testing), with no decrease on overall test coverage and/or test quality.

Scan response vectors obtained using such an approach may thus be rendered free of errors (garbled response bits in the response vector due to the set-up timing violations noted with respect to FIG. 1A). The operation of encoder 490 as described above is illustrated further with respect to an example timing diagram.

Timing Diagram

Figure 5:
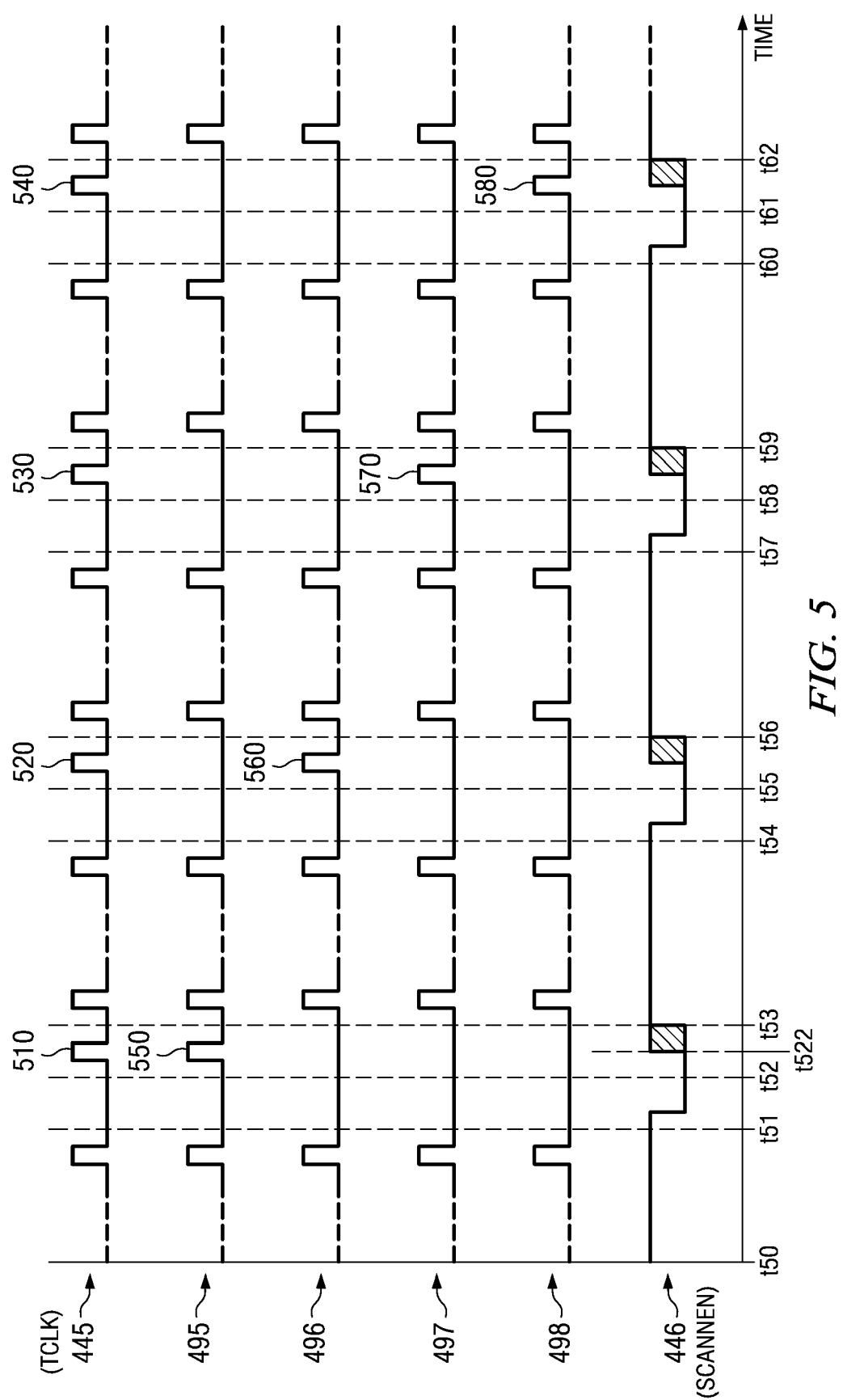
FIG. 5 is a timing diagram illustrating the manner in which various signals are generated during a scan based test in an embodiment of the present invention.

FIG. 5 is a timing diagram illustrating respective waveforms during scan based test in an embodiment of the present invention. Waveforms of 445 (TCLK), 495, 496, 497, 498 and 446 (SCANEN) are shown. With respect to waveform 445 (TCLK) time intervals t50 to t51, t53 to t54, t56 to t57, t59 to t60 represent shift cycles (either shift-in or shift-out), and time intervals t52 to t53, t55 to t56, t58 to t59, t61 to t62 represent capture cycles. Corresponding shift and capture cycles provided to each of the four clock domains 450, 460, 470 and 480 (FIG. 4) are represented respectively by waveforms (or clocks) 495, 496, 497 and 498. Time intervals t51-t52, t54-t55, t57-t58 and t60-t61 represent dummy cycles before the following capture cycle to provide for possible delay in SCANEN (446), and to also to the ATPG tools toggle Scan Enable from 1 to 0 which triggers our novel circuit.

Pulses 510, 520, 530 and 540 represent capture pulses generated by the test equipment on TCLK (445) in the corresponding capture cycles shown in FIG. 5. It may be observed that encoder 490 activates a capture cycle for only one of the four clock domains in a capture interval. Thus, during the capture cycle t52 to t53, encoder pulses only clock 495, as represented by pulse 550. Similarly, during the capture cycle t55 to t56 encoder pulses only clock 496, as represented by pulse 560. During the capture cycle t58 to t59 encoder pulses only clock 497, as represented by pulse 570. During the capture cycle t61 to t62 encoder pulses only clock 498, as represented by pulse 580. Dashed intervals of SCANEN (e.g., interval t522 to t53) represent time intervals during which SCANEN may be switched to logic 1 by the tester, based on the specific bit sequence in the test vector provided by the tester. While the details of FIGS. 4 and 5 are described with respect to a scenario in which four clock domains are present in an IC, the techniques described above can be extended for any other number of clock domains as well.

The technique noted above overcomes the hold violation problem noted with respect to FIG. 1A. To briefly illustrate, assuming the above described technique is used in the example scenario illustrated in FIG. 2, only one of the two clock inputs (135A and 135B) of FIG. 2 would be pulsed to perform a capture operation. As a result, even assuming the two clocks are skewed with respect to each other, the problem of element 226 storing a 'new' (and therefore incorrect) data as noted above with respect to description of FIG. 2 is overcome.

Further, since the technique is implemented using circuitry (encoder 490) within IC 400, a tester may provide a single test clock (TCLK 445), instead of multiple test clocks as noted above. As a result, the number of pins on IC 400 that need to be provide for receiving test clocks is reduced to one, thereby enabling a larger number of pins to be used for the scan chains, and/or enabling more number of devices to be tested in parallel (simultaneously). Tester cost may be reduced as the number of pins on the tester may also be correspondingly reduced.

Buffers to overcome the hold time violations may not be required. Thus, it may also be appreciated that the features of the present invention enable implementation of IC 400 with reduced area requirement and reduced power consumption/dissipation. Further, the features described above are compatible with various ATPG tools in terms of usage, and therefore there may be no impact on generation of test patterns. As described below, features of the present invention also minimize impact (or cause no impact at all) on test quality (test coverage, i.e., number of stuck-at faults that can be tested for during a scan based test). The manner in which encoder 490 can be implemented in an embodiment is described below.

Encoder

Figure 6A:
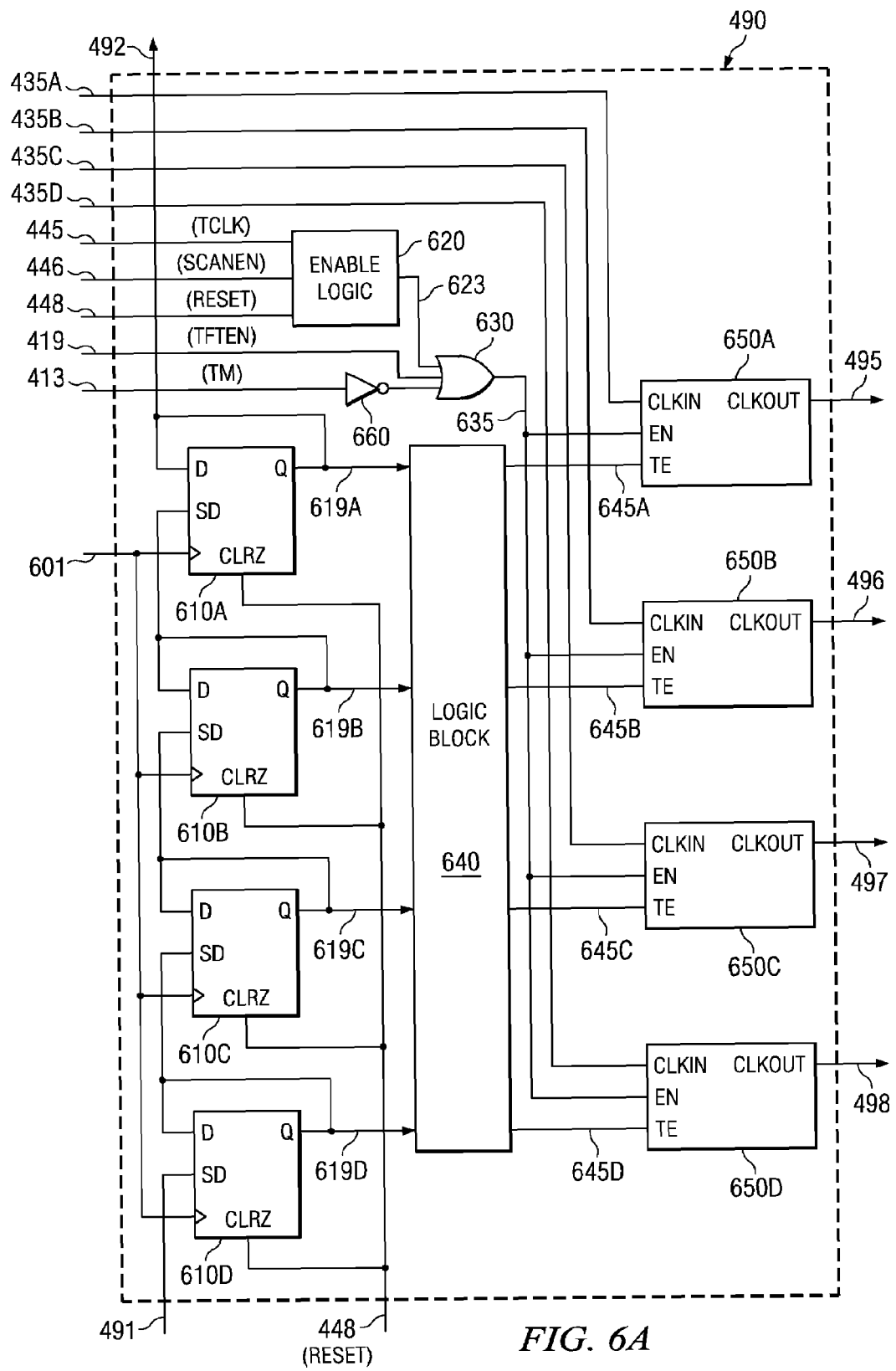
FIG. 6A is a block diagram of an encoder implemented to provide clock signals to various clock domains of an IC, in an embodiment of the present invention.

FIG. 6A is a block diagram illustrating the details of encoder 490 in an embodiment of the present invention. Encoder 490 is shown containing flip-flops 610A-610D, logic block 640, latches 650A-650D, enable logic 620, OR gate 630 and inverter (NOT gate) 660.

Each of latches 650A-650D contains two enable inputs (denoted as EN and TE in FIG. 6A). The logic values on the enable inputs EN and TE are internally 'ORed'. The latches forward the signal on the 'Clkin' terminal on the 'Clkout' terminal only if the result of a logical OR operation on the corresponding EN and TE inputs is at logic 1. To illustrate, if EN and TE inputs (paths 635 and 645A respectively) to latch 650A are such that an OR operation on them is a logic 1, latch 650A forwards the clock on path 435A on path 495. Similarly, latches 650B, 650C and 650D respectively forward clocks on respective paths 435B, 435C and 435D on paths 496, 497 and 498 based on the OR result of the corresponding EN and TE inputs. Latches 650A-650D may thus be viewed as 'clock-gating elements'.

Enable input EN (635) provided to latches 650A-650D is generated via components enable logic 620, inverter 660 and OR gate 630 based on the value of signals 445 (TCLK), 446 (SCANEN), 448 (RESET), 419 (TFTEN) and 413(TM). 419 (TFTEN) and 413(TM) are generated by controller 410 (FIG. 4), and are logic 0 and logic 1 respectively during scan based test mode.

During functional mode (normal operation of IC 400), 419 (TFTEN) and 413(TM) are each logic 0. During 'at-speed test', 419 (TFTEN) and 413(TM) are each logic 1. As is well-known in the relevant arts, 'at-speed test' (also referred to as transition fault testing) refers to test procedures in which the operation of the components and interconnecting paths in an IC are verified for compliant (desired) operation at the normal (intended) operating speed of IC 400. During scan based testing, the combination of enable logic 620, inverter 660 and OR gate 630 (FIG. 6A) cause path 635 to be at logic 0 during capture cycles, and a logic 1 during shift-in and shift-out cycles.

Figure 6B:
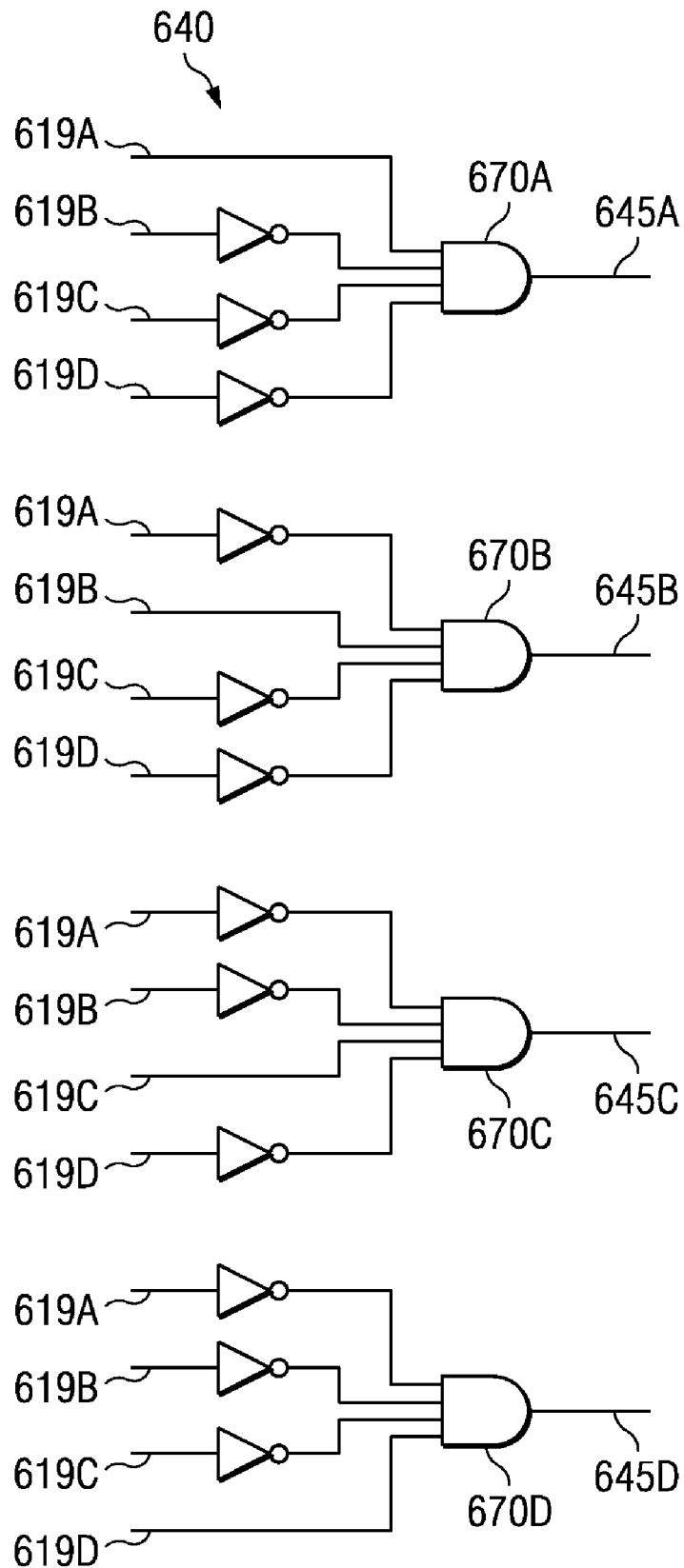
FIG. 6B illustrates the details of a logic block implementing one-hot logic, in an embodiment of the present invention.

Logic block 640 is implemented as a 'one-hot' encoder, and the internal details in an embodiment are illustrated in FIG. 6B. As is well known in the relevant arts, a 'one-hot' encoder is generally a circuit in which valid input-bit combinations are such that one bit is a logic 1, while all others are a logic 0. In FIG. 6B, 670A-670D are each four-input AND gates, and receive the outputs 619A-619D of flip-flops 610A-610D. As may be observed from the Figure, one input of each AND gate is provided directly, while the other three inputs are inverted using corresponding inverters shown in the Figure. Thus, when the outputs 619A-619D have any one of the pattern values "1000", "0100", "0010", "0001", outputs 645A-645D of logic block 640 will also have the respective values "1000", "0100", "0010", "0001".

Flip-flops 610A-610D may be contained in a scan chain formed within any one of the four clock domains 450, 460, 470 and 480 (FIG. 4). When IC 400 is in scan based test mode, path 491 represents the output of the element preceding flip-flop 610D in the scan chain, and path 492 represents the output to the element following flip-flop 610A in the scan chain. Flip-flops 610A-610D are connected in a sequence, with the output of one being provided as an input to a next one (except for the output of flip-flop 610A).

Each of flip-flops 610A-610D receives clock 601, which represents the corresponding clock path provided to the clock domain within which each of flip-flops 610A-610D are contained. To illustrate, assuming flip-flops 610A-610D are contained within clock domain (circuit portion) 450 (FIG. 4), path 601 would be the same as path 435A, which is the clock path corresponding to clock domain 450. Alternatively flip-flops 610A-610D may be implemented to form a stand-alone scan chain (not contained in any of clock domains 450, 460, 470 and 480). In such an implementation, two additional pins (one each for scan-in and scan-out, not shown) of IC 400 may be required to connect to paths 491 and 492 to an external tester.

Since flip-flops 610A-610D are contained in a scan chain, and since their respective outputs are connected to the one-hot encoding logic in logic block 640, an ATPG tool (such as test vector 190 of FIG. 1B) generates test patterns such that any of the patterns "1000", "0100", "0010", "0001" is loaded into flip-flops 610A-610D at the end of a shift-in (load) cycle. It is noted that ATPG tools would automatically generate test patterns to test valid one hot combination inputs since the one hot encoder is an integral part of the circuit design.

As an illustration, referring to FIG. 5, the pattern stored in flip-flops 610A-610D at time instance t51 may be "1000" (flip-flop 610A storing a logic 1, and flip-flops 610B-610D each storing a logic 0). As a result, path 645A is at logic 1, while paths 645B-645D are a logic 0 each. Since path 645A is at logic 1, latch 650A passes clock on path 435A to path 495. Therefore, a capture pulse (550 in FIG. 7A) occurs only on clock path 495 reflecting the capture pulse 510 of test clock TCLK (445). Outputs 496-498 of respective latches 650B-650D are maintained at logic 0 in the interval t52-t53 (FIG. 5), since signals 645B-645D and path 635 are at logic 0. During shift-in interval t50-t51 and shift-out interval t53-t54, path 635 is at logic 1, and each of latches 650A-650D passes the respective clocks on terminals Clkin onto corresponding output paths (Clkout) 495-498, thereby causing the corresponding test vector for each of clock domains to be shifted in and shifted out.

Figure 7A:
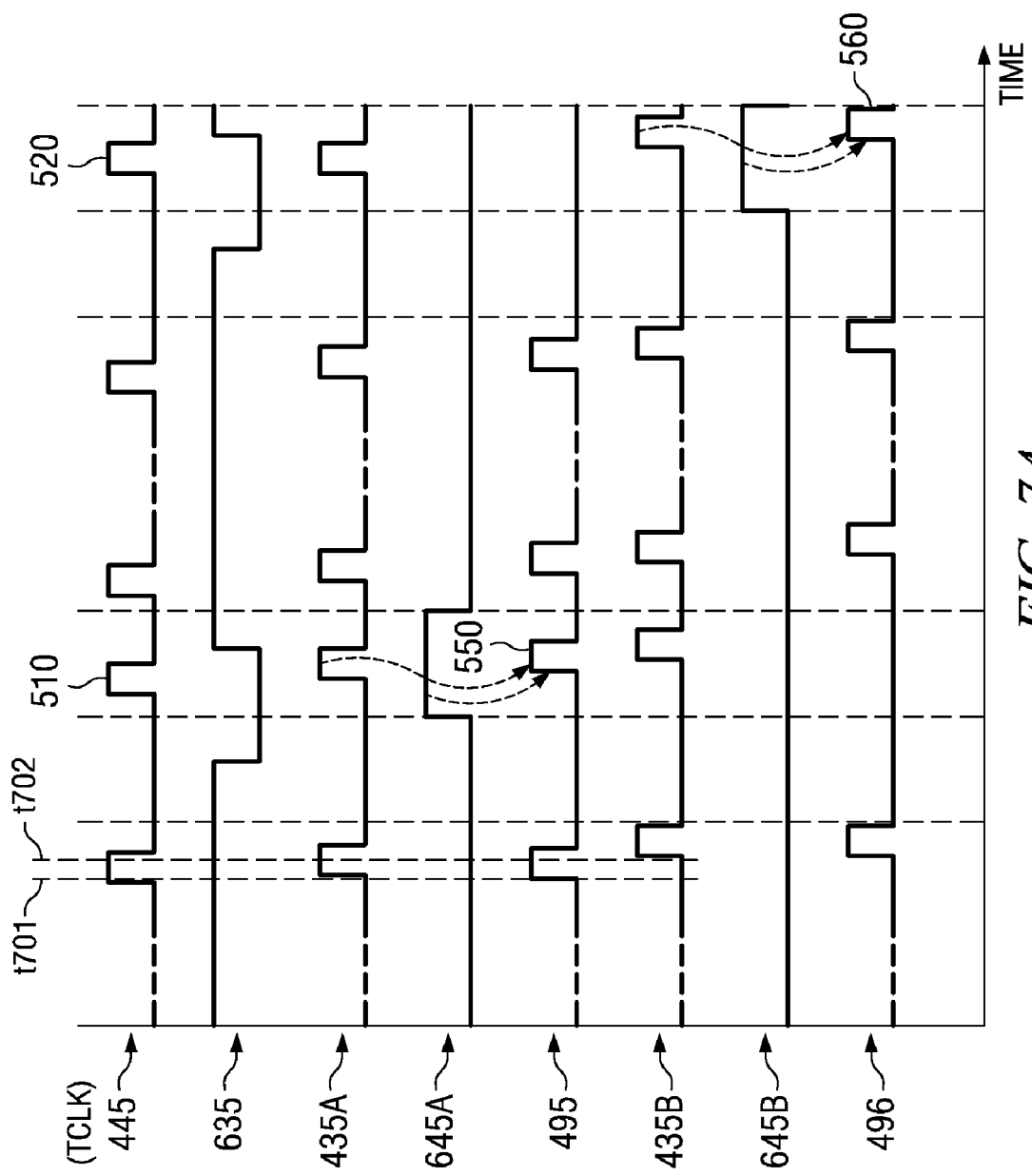
FIG. 7A is a timing diagram illustrating the waveforms of various signals in an encoder in an embodiment of the present invention.

Corresponding to a next capture cycle (t55-t56), the pattern contained in flip-flops 610A-610D may be "0100", and a capture pulse is generated only on path 496. It may be verified that respective patterns "0010" and "0001" loaded on flip-flops 610A-610D cause capture pulses to be generated only corresponding paths 497 and 498. Thus, the implementation of logic block 640 as a 'one-hot' encoder causes an ATPG (test pattern generator) tool to generate test patterns such that the specific patterns "1000", "0100", "0010", "0001" are loaded in flip-flops 610A-610D immediately prior to a capture cycle. Consequently, during a capture pulse of test clock 445, only one of the clocks 495-496 provided to respective clock domains 450, 460, 470 and 480 is pulsed, thereby overcoming the set-up time violation noted above. In FIG. 7A, waveforms illustrating the description above are shown for two capture cycles 510 and 520, and the corresponding capture pulses 550 and 560 generated for clock domains 450 and 460. Time interval t701-t702 represents the skew between clocks 435A and 435B.

It is noted that during the functional mode or at-speed testing of IC 400, all the clock domains receive their respective functional clocks (signal 413 being logic 0, and signal 635 being logic 1), thus making the latches transparent during the functional mode. Hence, the technique described above does not affect operations during either the function (normal) mode or at-speed test. It is understood that the description provided above with respect to FIGS. 4, 5, 6A, 6B, 7A and 7B corresponds to a scenario in which IC 400 has four clock domains.

The techniques described can be extended for larger or smaller number of clock domains as well, as will be apparent to one skilled in the relevant arts. It is noted that for an IC having N clocks domains, the techniques described above require '2N+2' sequential elements (in addition to the combinational logic contained in logic block 640), with flip-flops 610A-610D and latches 650A-650D being the 2N sequential elements, and enable logic 620 containing the remaining 2 sequential elements (illustrated below with respect to FIG. 7B).

It is noted that while EN signal 635 may be replaced by SCANEN (446) (both waveforms meeting the requirement that they be logic 0 during a capture cycle, and a logic 1 otherwise), such an approach may cause a reduction in the number of stuck-at faults that could potentially be uncovered by a scan test. Such reduction may occur due to the ATPG tool potentially generating test patterns in which SCANEN (446) is maintained as a logic '1' during a capture cycle (without pulsing to logic 0, as required for the technique described above to operate as desired).

Hence, in an embodiment of the present invention, it is expressly specified to an ATPG tool (via corresponding inputs to the tool) to cause SCANEN (446) to pulse to a logic 0 prior to a capture cycle. Further, no constraint is specified to the ATPG tool with respect to the value of SCANEN (446) during a capture cycle, thereby allowing the tool to generate patterns corresponding to which SCANEN (446) may be maintained at logic 1. It is noted here that the above requirements (pulsing SCANEN to logic 0 prior to a capture cycle, but not constraining SCANEN during the capture cycle itself) can be specified to an ATPG tool (such as test vector generator 190 of FIG. 1B) via test procedure file(s) provided as input to the ATPG tool. Enable logic 620 is implemented to generate signal 623 to enable generation of signal 635 as described above.

Figure 7B:
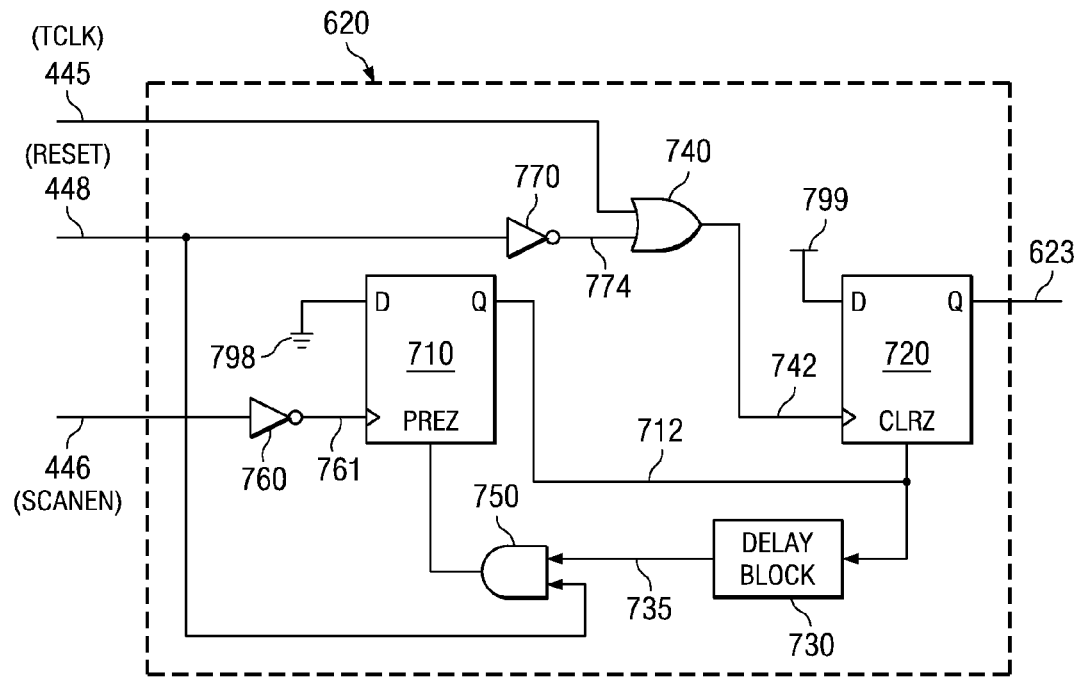
FIG. 7B is a block diagram of an enable logic in an embodiment of the present invention.

FIG. 7B is a circuit diagram illustrating the internal details of enable logic 620 in an embodiment of the present invention. Enable logic 620 is shown containing (sequential elements) flip-flops 710 and 720, delay block 730, OR gate 740, AND gate 750, and NOT gates 760 and 770. D-inputs of flip-flops 710 and 720 are respectively connected to ground 798 and power supply 799. Flip-flops 710 and 720 are not a part of any scan chain in IC 400.

Figure 8:
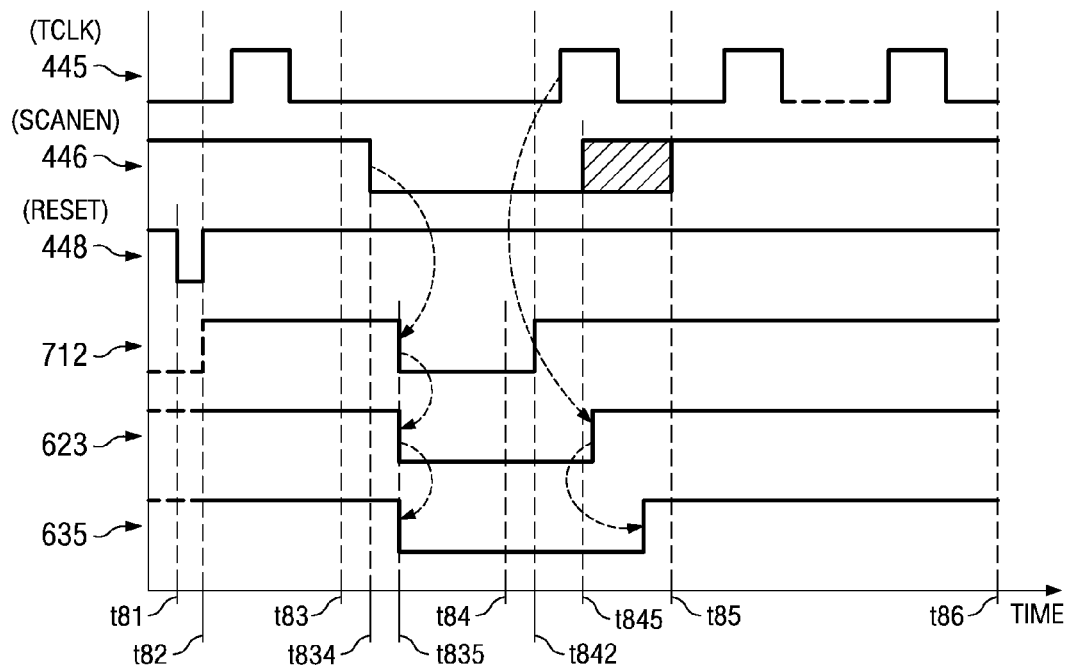
FIG. 8 is a timing diagram illustrating the operation an enable logic in an embodiment of the present invention.

Waveforms illustrating the operation of the circuit of FIG. 7B are shown in FIG. 8. It is assumed in the following description that internal delays and path delays in the components of FIG. 7B are zero. IC 400 is reset by RESET (448) pulsing to logic 0 in the interval t81-t82. The logic 0 value of RESET (448) provided to the active low preset (PREZ) input of flip-flop 710 causes its output 712 to be set to logic 1. When RESET pulses to logic 0, path 774 pulses to logic high causing a logic 1 (since D-input of flip-flop 720 connected to power supply 799) to be provided by flip-flop 720 on output 623. As a result signal 635 (FIG. 6A) is set to logic 1. Time interval t82 to t83 represents a scan-in interval, and may contain several TCLK (445) pulse, although only one is shown.

At time instance t834, SCANEN (446) changes to logic 0. As a result, path 761 changes to logic 1, and output 712 changes to logic 0 (D input of flip-flop 710 being tied to logic 0, shown occurring at time instance t385). Output 712 being at logic 0 clears flip-flop 720 via its CLRZ input, and signal 623 changes (at t835) to logic 0. Referring to FIG. 6A, signal 623 changing to logic 0 causes output 635 of OR gate 630 to change to logic 0. The logic 0 on path 712 appears on path 735 after a delay provided by delay block 730. As a result, the output of AND gate 750 to pulse to logic 0, thereby presetting output 712 of flip-flop 710 to logic 1(shown occurring at time instance t842). TCLK 445 changes to logic 1 in the capture interval (t84-t85), thereby causing output 623 of flip-flop 720 to change to 1. In response, signal 635 changes to logic 1. Interval t85 to t86 represents a following shift-out interval.

As noted above, an ATPG tool (such as test vector generator 190 of FIG. 1B) generating test vectors (plus signals SCANEN, TCLK, etc) for scan test of IC 400 is specified to cause SCANEN to change to zero before a capture cycle. The ATPG tool is also instructed to add dummy cycles before every capture cycle, as shown in FIGS. 5, 7 and 9. In FIG. 8, a dummy cycle is shown in the interval t82 to t83. Such dummy cycles are added to compensate for the any delay in the generation of signal 623 by the circuit of FIG. 7B. In addition, such dummy cycles provide for an interval during which the ATPG tool may toggle SCANEN (446) from logic 1 to logic 0, thereby allowing the circuit of FIG. 7B to operate as desired.

As is well known in the relevant arts, constraining a signal to remain at a specific value (logic level) during any interval generally limits the freedom (capability) of the ATPG tool to toggle the signal. With such limited controllability of signals, the ATPG tool might not be able to generate patterns to cover a large set of stuck-at faults, thereby leading to reduced test coverage. Since SCANEN (446) is not constrained during a capture cycle, the ATPG tool is free to change SCANEN to logic 1 (interval t845 to t85 in FIG. 7). Thus, the fault coverage is not affected adversely, and maximum fault coverage as supported by the test approach (test vectors) can be achieved.

It may thus be appreciated that various features of the present invention avoid hold/setup time violations during scan testing. While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
    a first circuit portion containing a first plurality of memory elements operating according to a first clock signal received on a first clock path;
    a second circuit portion containing a second plurality of memory elements operating according to a second clock signal received on a second clock path;
    an interacting path from an output path of a first memory element in said first circuit to a data input of a second memory element in said second circuit; and
    an encoder to receive a third clock signal on a third clock path and a fourth clock signal on a fourth clock path, said encoder to also receive one or more signals indicating durations in which said integrated circuit is being tested according to a scan based test approach and a scan enable signal indicating capture cycles during said test,
    said encoder operating to provide capture pulses on said first clock path and said second clock path, said encoder controlling the timing of provision of said pulses on said first clock path and said second clock path during said capture cycles such that a timing violation is avoided in said second memory element when receiving data from said first memory element.

2. The integrated circuit of claim 1, wherein said encoder is designed to forward a capture pulse on only one of said first clock path and said second clock path in each capture cycle.

3. The integrated circuit of claim 2, further comprising:
    a pin to receive a test clock, said test clock containing a capture pulse in each of said capture cycles;
    a first multiplexer to forward said test clock or a first functional clock on said third clock path according to a first select signal, wherein said first select signal is at one value in said scan based test mode and at a second value otherwise; and
    a second multiplexer to forward said test clock or a second functional clock on said fourth clock path also according to said first select signal.

4. The integrated circuit of claim 3, wherein said encoder is designed to forward said test clock, including the capture pulse, received on one of said third clock path and said fourth clock path, and to block the capture pulse of the other clock path.

5. The integrated circuit of claim 4, wherein said one or more signals further indicate whether said integrated circuit is being tested in an at-speed mode or in a stuck-at-fault mode, wherein said encoder blocks the capture pulse of said other clock path only in said stuck-at-fault mode.

6. The integrated circuit of claim 5, further comprising a third plurality of memory elements operable to receive a respective pattern in each of a sequence of scan cycles, wherein the pattern determines the specific one of said first circuit portion and said second circuit portion to receive the capture pulse in the corresponding scan cycle.

7. The integrated circuit of claim 6, wherein all of said third plurality of memory elements are contained in said first circuit portion or said second circuit portion.

8. The integrated circuit of claim 6, wherein the pattern comprises a pair of bits, each bit corresponding to a corresponding one of said first circuit portion and said second circuit portion and indicating whether the corresponding capture pulse is to be forwarded or blocked, said third plurality of memory elements also containing only a pair of elements, wherein said encoder further comprises:
    a first clock gating element to forward said third clock signal on said third clock path when one of a first enable signal and a third enable signal is a logic one, wherein said third enable signal is at logic one when said integrated circuit is in functional mode or in said at-speed mode or during shift cycles during said scan based test approach;

a second clock gating element to forward said fourth clock signal on said fourth clock path when one of a second enable signal and said third enable signal is a logic one; and a logic block to receive the outputs of said third plurality of memory elements and to generate said first enable signal and said second enable signal.

9. The integrated circuit of claim 8, wherein said logic block is implemented as a one-hot encoder which generates said first enable signal to equal one of said pair of bits and said second enable signal to equal the other bit.

10. The integrated circuit of claim 9, further comprising an enable logic, said enable logic comprising:

a first memory element and a second memory element, each having a data input, a data output, a clear terminal and a preset terminal;

a delay block, an AND gate, an OR gate, a first inverter and a second inverter, wherein the data input of said first memory element is coupled to a first reference potential, wherein the data input of said second memory element is coupled to a second reference potential, the data output of said memory element is coupled to the clear terminal of said second memory element and the input terminal of said delay block, wherein the output of said delay block is coupled to a first input of said AND gate, wherein a second input of said AND gate is coupled to a reset input of said integrated circuit, wherein an output of said AND gate is coupled to said preset terminal of said first memory element, wherein an input of said first inverter is coupled to said reset input, an output of said first inverter being coupled to a first input of said OR gate, a second input of said OR gate being coupled to said test clock, an output of said OR gate being provided as a clock input to said second memory element, an input of said second inverter being coupled to said scan enable signal, an output of said second inverter being provided as a clock input to said first memory element.

11. The integrated circuit of claim 10, further an OR logic to receive as inputs a data output of said second memory element, a test mode signal indicating whether said integrated circuit is to be operated in functional mode or not, an at speed test enable signal indicating whether said integrated circuit is to be tested in at-speed more or not, said OR logic to provide said third enable signal.

* * * * *

UNITED STATES PATENT AND TRADEMARK OFFICE
CERTIFICATE OF CORRECTION

PATENT NO. : 7,624,322 B2  Page 1 of 1
APPLICATION NO. : 12/247228
DATED : November 24, 2009
INVENTOR(S) : Duggal et al.

It is certified that error appears in the above-identified patent and that said Letters Patent is hereby corrected as shown below:

On the Title Page, after Item (22) but before Item (65) please insert and correct to read:

Item
-- (30)     Foreign Application Priority Data
       November 12, 2007   (IN) .......................................... 2613/CHE/2007 --

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,624,322 B2  Page 1 of 1
APPLICATION NO. : 12/247228
DATED : November 24, 2009
INVENTOR(S) : Duggal et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 27 days.

Signed and Sealed this

Twenty-sixth Day of October, 2010

David J. Kappos
*Director of the United States Patent and Trademark Office*